US011693159B2

(12) United States Patent
Craen et al.

(10) Patent No.: US 11,693,159 B2
(45) Date of Patent: Jul. 4, 2023

(54) ADAPTIVE LENS (71) Applicant: poLight ASA, Skoppum (NO)

(72) Inventors: Pierre Craen, Embourg (BE); Vladimir Kartashov, Horten (NO); Nicolas Tallaron, Lyons (FR)

(73) Assignee: poLight ASA, Skoppum (NO)

( * ) Notice: Subject to any disclaimer, the term of this patent is extended or adjusted under 35 U.S.C. 154(b) by 134 days.

(21) Appl. No.: 16/623,698

(22) PCT Filed: Jun. 28, 2018

(86) PCT No.: PCT/EP2018/067386
§ 371 (c)(1),
(2) Date: Dec. 17, 2019

(87) PCT Pub. No.: WO2019/002448
PCT Pub. Date: Jan. 3, 2019

(65) Prior Publication Data
US 2020/0310006 A1  Oct. 1, 2020

(30) Foreign Application Priority Data

Jun. 30, 2017  (EP) ..................................... 17179006
Jun. 30, 2017  (EP) ..................................... 17179023

(51) Int. Cl.
*G02B 3/14*         (2006.01)
*G02B 26/08*        (2006.01)
(Continued)

(52) U.S. Cl.
CPC .............. *G02B 3/14* (2013.01); *G02B 26/004* (2013.01); *G02B 26/0858* (2013.01);
(Continued)

(58) Field of Classification Search
CPC ........... G02B 3/14; G02B 26/004; G02B 3/12
See application file for complete search history.

(56) References Cited

U.S. PATENT DOCUMENTS

| | | | | |
|---|---|---|---|---|
| 7,643,217 B2 * | 1/2010 | Yokoyama | ........... | G02B 26/004 359/666 |
| 7,646,544 B2 * | 1/2010 | Batchko | ................. | F03G 7/065 359/666 |

(Continued)

FOREIGN PATENT DOCUMENTS

| | | | | |
|---|---|---|---|---|
| DE | 3712145 A1 | 3/1988 | | |
| EP | 2239600 A1 * | 10/2010 | ........... | G02B 26/004 |

(Continued)

OTHER PUBLICATIONS

Pieroni, Michael, et al. "Electrically tunable soft solid lens inspired by reptile and bird accommodation." Bioinspiration & biomimetics 11.6 (2016): 065003. (Year: 2016).*

(Continued)

*Primary Examiner* — Christopher Stanford
(74) *Attorney, Agent, or Firm* — Knobbe Martens Olson & Bear LLP (57) ABSTRACT

The invention relates to a tunable lens where the optical power can be adjusted. The lens consists of a deformable, non-fluid lens body sandwiched between a thin, flexible membrane and transparent back window, and an actuator system serving to change the overall shape of the membrane and lens body. The membrane is pre-shaped to have a Sag or Sagittal of at least 10 μm so that the lens has a non-zero optical power when the actuator system is not activated. In order to achieve a large optical power range for the lens, the membrane should preferably be made of a material having a Young's modulus in the range 2-1.000 MPa.

10 Claims, 6 Drawing Sheets

(51) Int. Cl.
  *G02B 26/00* (2006.01)
  *G02B 27/64* (2006.01)
  *G02C 7/08* (2006.01)
  *H10N 30/00* (2023.01)
  *H10N 30/20* (2023.01)

(52) U.S. Cl.
  CPC ........... *G02B 27/646* (2013.01); *G02C 7/085* (2013.01); *H10N 30/1071* (2023.02); *H10N 30/2048* (2023.02)

(56) References Cited

U.S. PATENT DOCUMENTS

| | | | | |
|---|---|---|---|---|
| 7,773,306 | B2 * | 8/2010 | Van As | G02B 26/005 359/666 |
| 8,254,034 | B1 * | 8/2012 | Shields | G02B 3/14 359/665 |
| 8,699,141 | B2 * | 4/2014 | Aschwanden | G02B 7/10 359/666 |
| 10,139,529 | B2 * | 11/2018 | Meneghini | G02B 1/06 |
| 10,535,961 | B2 * | 1/2020 | Cote | F21L 4/02 |
| 10,866,432 | B2 * | 12/2020 | Stevens | G02B 3/14 |
| 2008/0304160 | A1 * | 12/2008 | Hendriks | G02B 15/00 359/666 |
| 2010/0091389 | A1 * | 4/2010 | Henriksen | G02B 3/14 359/811 |
| 2010/0208194 | A1 | 8/2010 | Gupta et al. | |
| 2010/0208357 | A1 * | 8/2010 | Batchko | G02B 5/20 359/666 |
| 2011/0038057 | A1 * | 2/2011 | Dharmatilleke | G02B 3/14 359/694 |
| 2011/0096411 | A1 * | 4/2011 | Henriksen | G02B 3/14 359/694 |
| 2011/0164330 | A1 * | 7/2011 | Henriksen | G02B 7/028 359/820 |
| 2011/0290887 | A1 | 12/2011 | Wang | |
| 2012/0300171 | A1 * | 11/2012 | Gupta | G02B 27/0025 623/6.22 |
| 2013/0176628 | A1 * | 7/2013 | Batchko | G02B 26/005 359/665 |
| 2017/0160442 | A1 * | 6/2017 | Phair | G02B 3/0081 |
| 2018/0256315 | A1 * | 9/2018 | Hildebrand | A61F 2/1635 |
| 2020/0310006 | A1 * | 10/2020 | Craen | G02B 26/004 |

FOREIGN PATENT DOCUMENTS

| | | | | |
|---|---|---|---|---|
| FR | 2962557 A1 * | 1/2012 | | F04B 43/043 |
| JP | 2010-504554 A | 2/2010 | | |
| JP | 2016-85463 A | 5/2016 | | |
| WO | WO-2005085930 A1 * | 9/2005 | | G02B 26/0875 |
| WO | WO-2008024071 * | 2/2008 | | G02B 3/14 |
| WO | WO-2008024071 A1 * | 2/2008 | | G02B 3/14 |
| WO | WO-2008035984 A2 * | 3/2008 | | G02B 3/0081 |
| WO | WO-2008100153 * | 8/2008 | | G02B 26/004 |
| WO | WO-2008100153 A1 * | 8/2008 | | G02B 26/004 |
| WO | WO-2009123606 A1 * | 10/2009 | | G02B 26/06 |
| WO | WO-2014118546 A1 * | 8/2014 | | G02C 7/083 |
| WO | WO 2016/009078 A1 | 1/2016 | | |
| WO | WO-2016133278 A1 * | 8/2016 | | C08J 3/075 |
| WO | WO-2018167738 A1 * | 9/2018 | | G02B 3/14 |

OTHER PUBLICATIONS

Beadie, G., et al. "Tunable polymer lens." Optics express 16.16 (2008): 11847-11857. (Year: 2008).*

Liebetraut, Peter, et al. "Tunable solid-body elastomer lenses with electromagnetic actuation." Applied optics 50.19 (2011): 3268-3274. (Year: 2011).*

Wapler, M. C., et al. "Ultra-compact, large-aperture solid state adaptive lens with aspherical correction." 2015 Transducers—2015 18th International Conference on Solid-State Sensors, Actuators and Microsystems (Transducers). IEEE, 2015. (Year: 2015).*

International Search Report for PCT/EP2018/067386 dated Aug. 2, 2018.

* cited by examiner

ADAPTIVE LENS

The present invention relates to an adaptive lens with a given, non-zero optical power (or, equivalently, finite focal length) that can be adjusted within an optical power range and methods for producing the lens.

BACKGROUND OF THE INVENTION

With the recent developments in optical equipment, such as cameras in mobile phones, scanning apparatus and machine vision, there is a demand for small lenses being capable of fast focusing. In mobile phone cameras, the number of pixels has been increasing but there is a demand for compact lenses of sufficient quality to use the full advantage of the pixels. This requires focusing capabilities in addition to small size, especially if the camera is also adapted to other purposes, such as reading bar codes and scanning images of objects close to the camera. Adding focusing capabilities to the lens also allows for use of larger apertures, thus increasing the light sensitivity of the system without suffering from the reduced depth of field of the lens.

Conventional glass lenses have been regarded as too expensive for many purposes even if they have been used in some mobile cameras but remain non-tuneable and research has been conducted to find other solutions. One promising area has been in the development of lenses made from soft polymers. These have some optical properties and may be shaped for focusing action by electrostatic forces, stretching the soft polymer lens or by shaping the soft polymer surface to obtain a chosen shape. Another proposed solution has been to use a soft polymer with a graded refractive index, but this has turned out to be complicated to produce in sufficiently good quality. The problems related to these solutions have been to obtain a sufficiently good lens surface, both in the curvature and the surface continuity quality Other proposed solutions incorporate using a liquid placed in a cavity inside a lens where the shape of the cavity is adjusted to adjust the focal length of the lens. Examples showing this are discussed in Japanese patent applications, publication Nos JP2002239769, JP2001257932, JP2000081503, JP2000081504 JP10144975 JP11133210, JP10269599 and JP2002243918. In addition this is discussed in a paper by T. Kaneko et al: "Quick Response Dynamic Focusing Lens using Multi-Layered Piezoelectric Bimorph Actuator", Micro-Opto-Mechanic Systems, Richard R. A. Syms Editor, Proceedings of SPIE, Vol. 4075 (2000). All of these are based on a liquid confined inside a cavity, which acts as a lens and where at least one of the surfaces may be shaped by an applied force. This has the disadvantage that the pressure applied to shape the lens has to compress the fluid or the cavity, which requires large forces, or additional chambers have to be provided to press a part of liquid out of the cavity. Volume changes due to temperature fluctuations may also cause problems.

The above solutions have drawbacks in that they
cannot provide real time adaptation
cannot really provide good optical quality
add thickness or complexity that is not suitable for miniature solutions such as camera modules in mobile phones
use liquid that is difficult in terms of manufacturing and results in low reliability and robustness and unstable performances.

It is a disadvantage of many of the prior art lenses with adjustable focus, that they are adjustable in a range around zero or very small optical power, meaning that they must be combined with traditional lenses for providing the necessary magnification/optical power and image forming capabilities. This increases costs and spatial requirements.

SUMMARY OF THE INVENTION

Thus, it is an object of this invention to provide a compact adjustable lens assembly suitable for mass-productions and with an inherent non-zero optical power.

In a first aspect, the invention provides an optical lens assembly comprising a deformable, non-fluid lens body sandwiched between a transparent back window and a transparent, flexible membrane to form a lens with an optical axis being normal to a surface part of the back window, the membrane being pre-shaped to impress a first overall shape to the membrane and the lens body with which the lens has a Sag of at least 10 µm, and an actuator system for applying a force to change the overall shape of the membrane and the lens body from the first overall shape to a second overall shape with which the lens has a different optical property.

In the following, a number of preferred and/or optional features, elements, examples and implementations will be summarized. Features or elements described in relation to one embodiment or aspect may be combined with or applied to the other embodiments or aspects where applicable. For example, structural and functional features applied in relation to the lens assembly also be used as features in relation to the method and vice versa. In addition, explanations of underlying mechanisms of the invention as realized by the inventors are presented for explanatory purposes, and should not be used in ex post facto analysis for deducing the invention.

That the transparent, flexible membrane is pre-shaped means that the membrane has obtained its shape prior to assembling in the lens-assembly. When assembled with the lens body and the back window, the membrane will preferably have a bell-shape (convex or concave) with a central section having a spherical or at least substantially spherical shape, corresponding to the shape of an ordinary lens surface. This is illustrated in FIG. 3B. The Sag of at least 10 µm resulting from the pre-shaping of the membrane is to be measured when the actuator system is not activated, i.e. the "default", "inherent" or "zero Volt" state of the lens. A circumference of the central section with the substantially spherical shape in the default state defines an aperture of the lens assembly.

Figure 2:
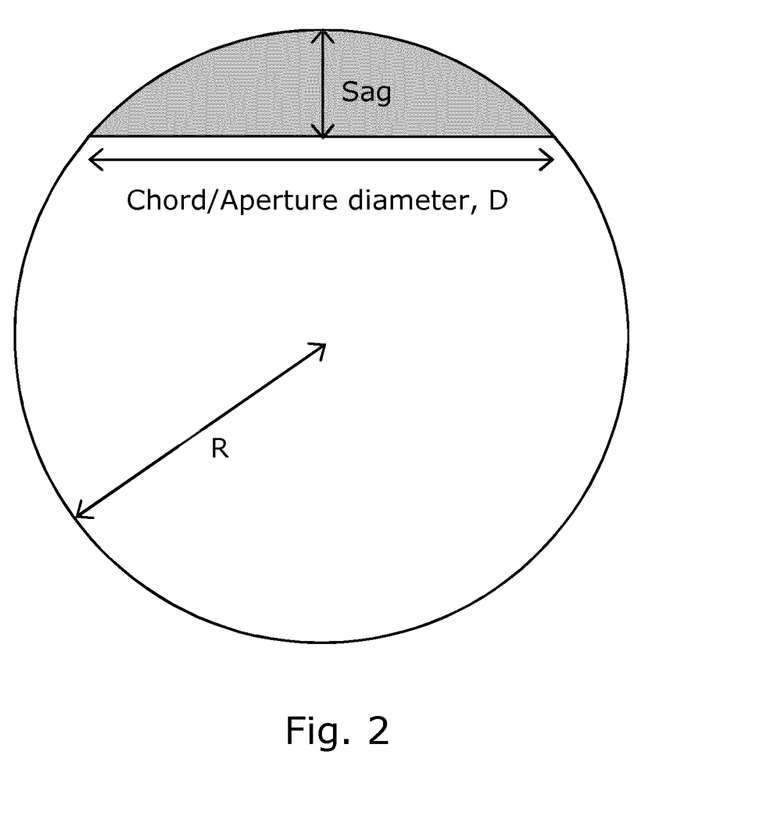
FIG. 2 illustrates various design parameters for a lens assembly according to the invention.

The Sag is illustrated in FIG. 2 and is defined as the height of the lens surface from its chord given by:

$$Sag = R - \sqrt{R^2 - \left(\frac{D}{2}\right)^2} \quad (1)$$

Where R is the radius of curvature (of the central section of the membrane) and D is the chord length equal to the diameter of the aperture. A Sag of at least 10 µm is not limited to specific values of aperture diameter or curvature radius (of the first overall shape) and thus accommodates for lenses of different sizes and strengths. In further embodiments, it is preferred that the Sag is at least 15 µm or at least 20 µm.

The Sag is related to the optical power (OP) by $$OP = 8 \cdot Sag \cdot \frac{n-1}{D^2} \quad (2)$$

where n is the refractive index of the lens body.

The following Table 1 gives exemplary values of chord length/aperture diameter and optical power for Sag≥10 μm and n=1.57.

TABLE 1

| D = [mm] | OP ≥ [Diopters] |
|---|---|
| 1.55 | 19 |
| 2 | 11 |
| 2.4 | 8 |
| 3 | 5 |
| 50 | 0.02 |

In the present description, the aperture refers to the aperture in the lens assembly as defined above, and not in the practical aperture of an optical device in which the lens assembly is used, which is often variable. Hence, for a given aperture size and lens body, there is a direct correlation between Sag and optical power, and these will be used interchangeably in the present description. Thus, in an alternative formulation, the first aspect of the invention may be defined using the optical power instead of the Sag, where with the first overall shape the lens has a substantial, non-zero first optical power. The preferred value of the first optical power (and the aperture size) depends largely on the application in which the lens assembly is to be used. In preferred embodiments, the first optical power is at least 5 diopters such as at least 10 diopters such as at least 20 diopters.

The inherent Sag or optical power of the first overall shape is advantageous since most prior art small adjustable lenses have zero or insubstantial inherent optical power, thus offering a total optical power at maximum voltage of maybe a few diopters. Hence, such lenses must typically be combined with a standard lens having the optical power around which adjustment is desired. Such lenses use a deformable membrane which is flat or almost flat at zero Volt and typically made of glass, e.g. Pyrex, sapphire, SiO$_2$ or BPSG, with Young's modulus in the range of tens of GPa. Examples of such lens assemblies may be found in e.g. WO 2008/035983, WO 2010/005315 or WO 2014/147060.

In this specification, the deformable, non-fluid lens body is preferably made from an elastic material. Since the lens body is non-fluid, no tight enclosure is needed to hold the lens body, and there are no risk of leakage. It is preferred that the lens body is non-fluid in that it has an elastic modulus larger than 300 Pa. In a preferred embodiment, the lens body is made from a soft polymer, which may include a number of different materials, such as silicone, polymer gels, a polymer network of cross-linked or partly cross-linked polymers, and a miscible oil or combination of oils. Using a soft polymer makes it possible to produce lenses where the polymer is in contact with air or other compressible gases, thus requiring much less force when adjusting the focal length of the lens. It also eases the production, as the polymer will keep in place even if the different production steps are localized in different positions or facilities. As mentioned above it also makes it possible to provide leakage channels or bubbles of compressible gas in order to reduce the required force necessary to adjust the lens and to reduce the strains caused by temperature and pressure fluctuations in the environment. In order not to exert any pressure on the relatively thin and soft membrane, the lens body preferably has an upper surface part having a shape corresponding to the shape of the pre-shaped membrane.

The back window is preferably a plane, transparent substrate of e.g. SiO$_2$ or glass. The back window preferably has a flat surface facing the lens body. The opposite surface facing away from the lens body may be flat or may have a convex or concave, e.g. spherical shape to constitute a backside of the lens. In other embodiments, however, the back window might be a curved substrate, such as a spherical surface section as well as aspheric shape.

The back window may form the cover glass for a device involving the lens assembly, such as a mobile phone camera. This will reduce the number of layers and improve the optical quality by reducing flare and improving transmittance. The back window may have an anti-reflect coating (ARC) and also provide an IR filter function, possibly combined with filtering properties of the lens body. In another embodiment, the back window forms part of a transparent substrate of a touch screen. Such touch screens are standard in many electronic devices, such as a mobile phones, tablets, computer monitors, GPSs, media players, watches, etc. Such a touch sensitive screen may be based on different touch screen technologies such as resistive systems, capacitive systems, Surface acoustic wave systems, infrared systems, etc., all of which involves a transparent substrate at its base.

In an alternative embodiment, an extra polymer layer is added between the back window and a cover glass on the side of the back window opposite the lens body. This provides the advantage of being more compact and better in terms of transmittance and ghost than prior art solutions, since it involves less air/glass interface. It also eliminates the need of AR coating on the back window.

It is preferred that the different optical property of the lens with the second overall shape of the membrane and the lens body is Sag and/or optical power and/or optical aberration. This means that changing the overall shape adjusts the Sag and thus optical power or aberration "on top of" the default first optical power of the lens. It is thus possible to make dynamic focus adjustment or dynamic aberration correction around almost any optical power using alone the lens according to the invention.

For a specific application where D and n are given, it is common to define the dynamical range of the tunable lens by its optical power values instead of the Sag values. The optical power range is the difference between highest and lowest optical power that the lens can obtain by means of the actuator system. The first optical power resulting from the pre-shaping of the membrane may be an end-point of or lie within this optical power range—the optical power is referred to as be adjustable "around" the first optical power in both these cases. It is preferred that the optical power range is at least 2 diopters or 4 diopters, such as at least 6 diopters or preferably at least 10 diopters. Corresponding Sag value ranges can be calculated using Equation (2) above.

Simulations and experiments have shown that in order for a pre-shaped membrane to provide a substantial optical power range, a membrane should preferably be soft and very flexible relative to prior art glass membranes. It is therefore preferred that the pre-shaped membrane in the lens assembly according to the first aspect is formed in a material having a Young's modulus in a range 1-10000 MPa, such as between 100 and 10000 MPa, such as between 100 and 7000 MPa, cor example between 100 and 5000 MPa, preferably in a range 2-1000 MPa.

The membrane may be formed in a large number of different materials, such as acrylics, polyolefins, polyesters, silicones, polyurethanes and others.

Preferable parameter ranges for the pre-shaped membrane are:

Thickness: 5-30 μm
Sag: 10-500 μm
Chord length/aperture diameter: 1-60 mm

A pre-shaped membrane with such thickness may not hold its shape if left by itself. When the lens body is sandwiched between the membrane and the back window, the dimensions of the setup and the size of the lens body are preferably adjusted so that the lens body will fill the convex space under the pre-shaped membrane and thus provide support for at least the central section of the membrane.

The membrane preferably remains un-stretched when the lens is assembled, so that the first overall shape is a result of the pre-shaping and the filling out by the lens body only. Obtaining the overall shape by inserting the lens body into the space between membrane and back window under pressure to "rise up" the membrane by stretching would result in very poor dynamical behavior.

The actuator system serves to change the overall shape of the membrane and the lens body. The actuator system may adjoin the membrane to change the overall shape or it may act on the membrane via another structure or medium, such as a support holding the membrane or the lens body or a fluid. In a preferred embodiment, the actuator system comprises piezoelectric actuators such as PZT on a surface of the membrane outside the central section. Such piezoelectric materials are easy to form and control, and compatible with wafer scale processing techniques. As they will typically be formed to encircle the central section of the membrane, they may also define an aperture for an optical setup using the lens assembly. In another preferred embodiment, the actuator system comprises a voice coil motor (VCM) which may offer a larger force and stroke or amplitude than piezoelectric actuators, and allowing space for larger apertures or any other means that could be used to apply a force that could result in a bending the pre-shape membrane, it could be a piezo actuator, electrostatic actuator or any other type of actuator.

In another preferred embodiment, the lens assembly according to the first aspect further comprises a rigid frame and encircling the lens body to support a circumference of the membrane. In this embodiment, the membrane, the frame and the back window forms a cavity holding the lens body. Such rigid frame may serve several purposes such as support for holding the membrane, transverse confinement of the lens body. The frame is preferably formed using wafer scale production techniques in e.g. silicon, and should be formed to be much less deformable than the membrane in order to serve as a rigid frame. This may be obtained with a silicon frame (Young's Modulus of few hundreds GPa) with thickness of hundreds of μm's or few mm's. Mechanical means may be needed to secure the concentricity of the membrane with respect to the back window. This required precision of this concentricity will vary depending of the application, the level of optical quality required as well as the optical power of each optical component of the optical system in which it is used.

While the membrane is preferably fixed to the frame, the back window may be attached only to the lens body and thus be free-floating in relation to the frame. This serves to compensate for thermal compensation since the lens body can expand with little or no impact on the membrane. In an alternative embodiment, the back window may be attached to the frame via a soft material to form a more closed and/or rigid structure. In this case, thermal expansion of the lens body may then be compensated for in other ways.

DETAILED DESCRIPTION OF THE INVENTION

The lens assembly according to preferred embodiments of the present invention build on top of the T-lens technology developed by poLight AS and described in detail in previous patent application such as WO 2008/035983, WO 2010/005315 or WO 2014/147060, hereby included by reference. More details on a T-lens assembly with which the pre-shaped membrane in accordance to the invention can be used may be found therein.

Figure 1:
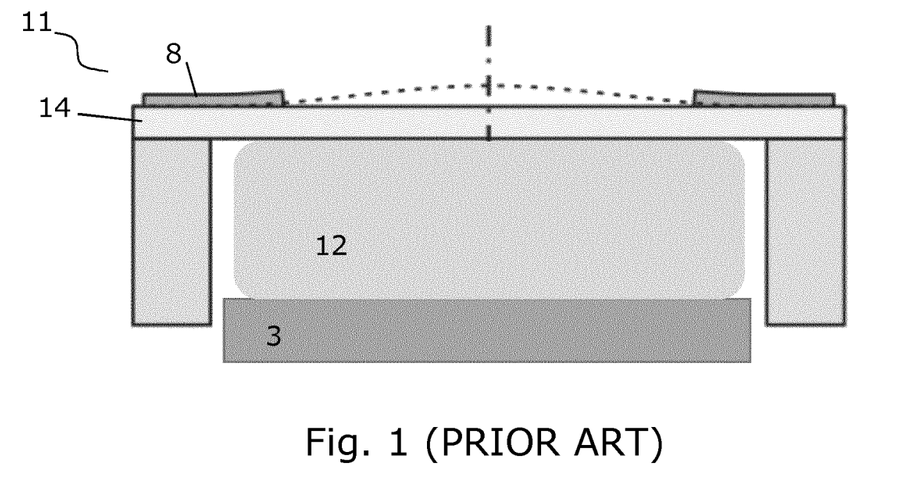
FIG. 1 illustrates an adjustable lens from a prior art document.

FIG. 1 illustrates a prior art adjustable lens 11 with a deformable body 12 sandwiched between a back window 3 and a flat, flexible membrane 14. Further, a piezoelectric film 8 is provided on the membrane which bend the membrane up (dashed line) to change an optical power when a voltage is applied.

Figure 3A:
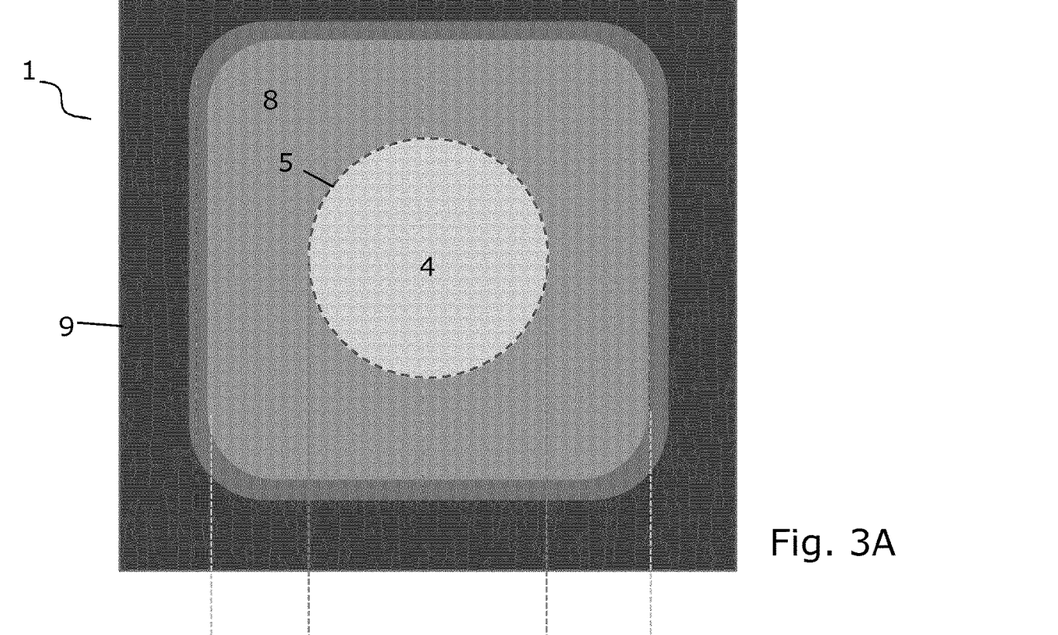
FIGS. 3A and B illustrate a top view and a cross-sectional side view of a lens assembly in accordance with a preferred embodiment of the invention.
Figure 3B:
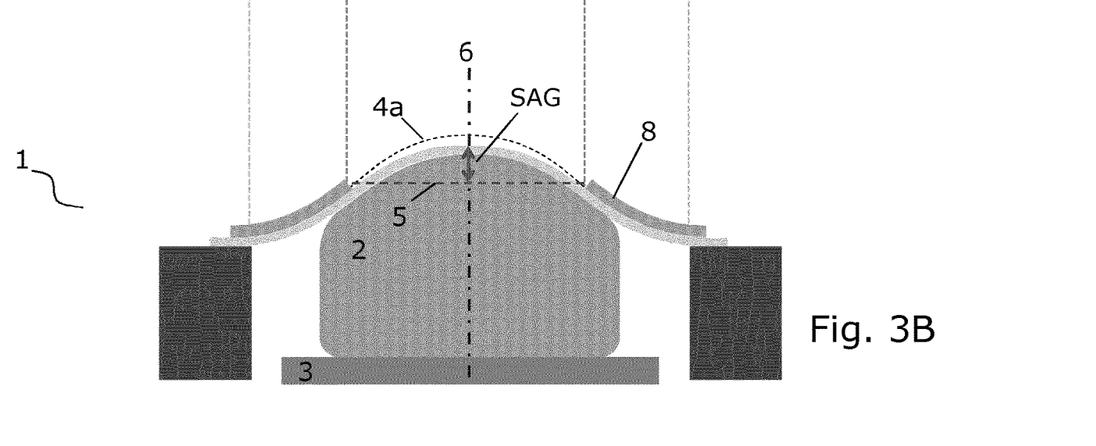

FIGS. 3A and B illustrate a top view (FIG. 3A) and a cross-sectional side view (FIG. 3B) of a lens assembly 1 in accordance with a preferred embodiment of the invention. Here, the lens assembly comprises a deformable, non-fluid lens body 2 sandwiched between a back window 3 and a transparent, flexible membrane 4 to form a lens with an optical axis 6 being normal to a surface part of the back window. The various components of the lens assembly is held together by a rigid frame 9 typically encircling the lens body. The frame 9 may comprise separate parts that also provide another function in the assembly. For example, the back window 3 can also act as a support for other components and may be part of the frame in this respect. The frame 9 forms a square opening with rounded corners. The membrane is pre-shaped to impress a first overall shape to the membrane and the lens body with which the lens has minimum Sag of at least 10 μm or a corresponding first optical power. Further, an actuator system 7 is provided for applying a force to change the overall shape of the membrane and the lens body from the first overall shape to a second overall shape (dashed line 4a) with which the lens has a different optical property.

A central section of the pre-shaped membrane has a substantially spherical shape to function as a lens surface, but may have small differences to correct for various optical aberrations. The pre-shaped form of the membrane can be a bell-shape (FIG. 3B), a spherical shape (not shown), or others. In the case of a bell-shaped membrane, the central section can be defined as lying within the inflection points in the curve, as the areas outside will have a concave shape and thus not contribute to the focusing. A circumference of or within this central section defines an aperture of the lens assembly. Generally, the larger the aperture, the larger is the lens and the more light can be collected by it.

The lens body 2 does not fill out the volume of the cavity formed between the membrane 4, frame 9 and back window 3 completely, and air or another compressible fluid fills the remaining volume. This allows for the change of size of this volume and thus the change of shape of the membrane.

The lens body can have a shape corresponding to the shape of the pre-shaped membrane so that abutting these will not change the shape of the membrane. This can be done by pre-shaping the lens body prior to assembly or by injecting a mouldable material in between the back window and the membrane. In a specific embodiment, a liquid reaction mixture is injected between the back window and the membrane. Then the lens is put into a furnace at high temperature for a specific time and the liquid reaction mixture turns to viscoelastic non-fluid polymer shaped to the shaped of the pre-shaped membrane.

Simulations

A number of simulations have been performed with the lens assembly illustrated in FIGS. 3A and B, with the actuator system comprising a piezoelectric PZT film 8. In the simulations, the layout of the PZT film and the Young's modulus of the membrane 4 are varied. Voltage to the PZT was varied between 0 V and 40 V, and the optical power range is equal to OP(40V)−OP(0V).

Figure 4A:
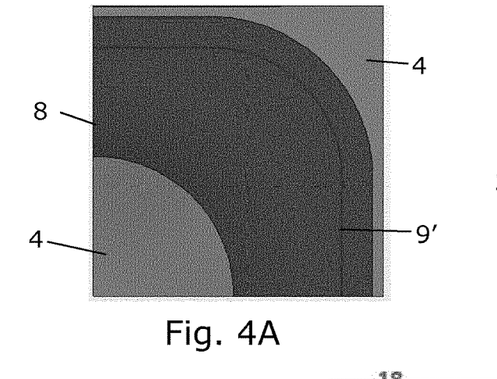
FIGS. 4A and B illustrate quarter top views of an embodiment of the lens assembly.
Figure 4B:
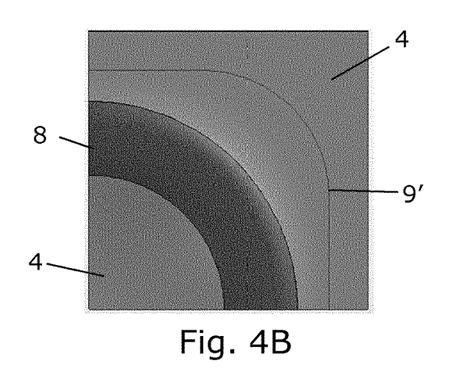
Figure 5A:
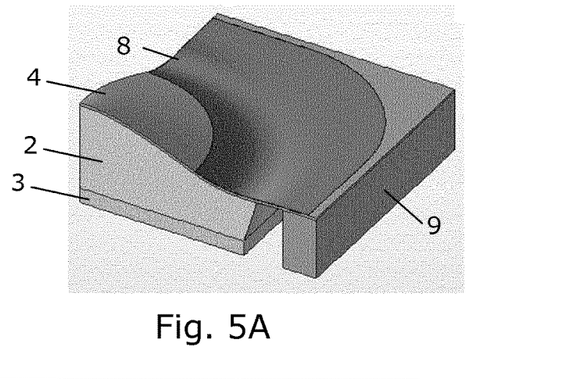
FIGS. 5A and B illustrate 3D views of an embodiment of the lens assembly.
Figure 5B:
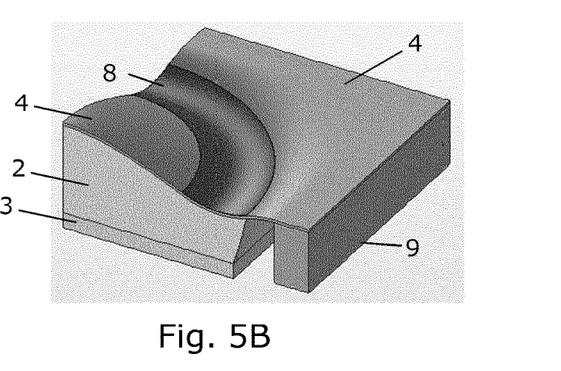

FIGS. 4A and B illustrate a quarter top view of the lens assembly illustrated in FIGS. 3A and B with two different layouts of piezo film 8. In both cases, the diameter of the hole in the PZT film is 1.55 mm and forms an aperture 5 concentrically with the central section of the membrane 4. FIGS. 5A and B illustrate a 3D view of the lens assemblies of FIGS. 4A and B, where the lens body 2, the back window 3 and the side walls 9.

Figure 6A:
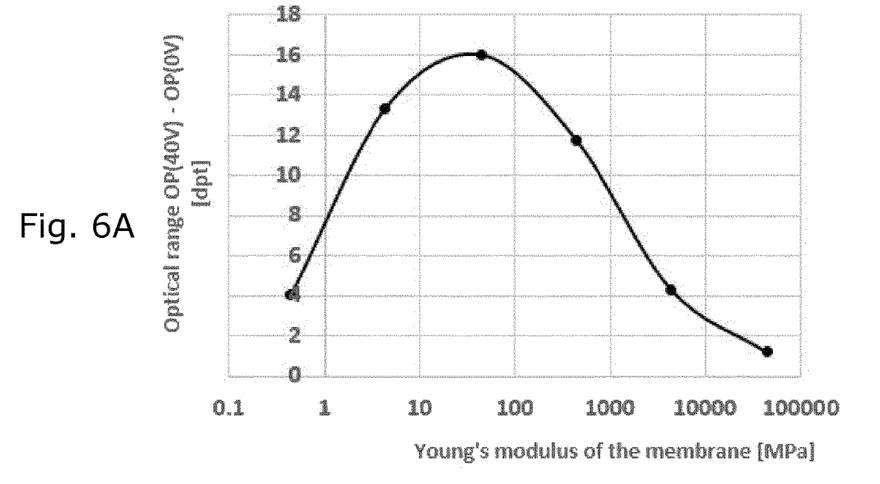
FIGS. 6A and B are graphs showing the dependence of the optical power range versus Young's modulus of the membrane for the embodiments of FIGS. 4A and B, respectively.
Figure 6B:
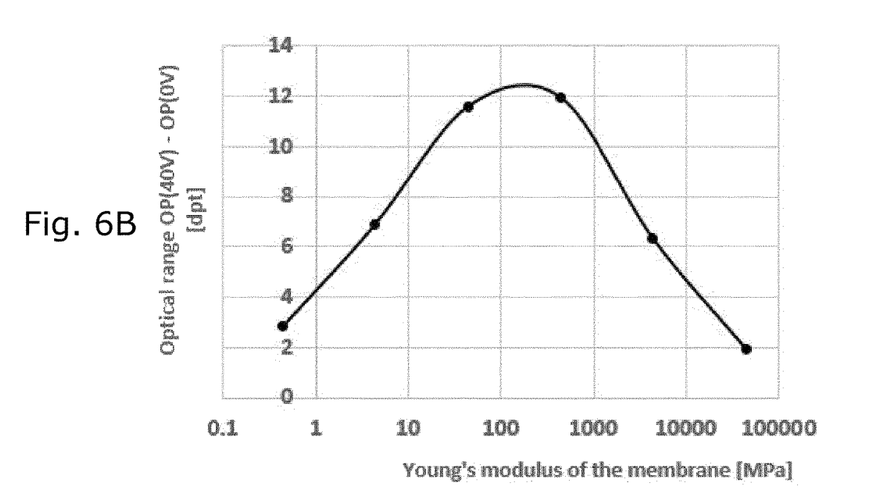

For both embodiments of FIGS. 4A and B, the Optical power range was simulated for varying Young's modulus of the membrane. The results are plotted in FIGS. 6A and B showing the dependence of the optical power range versus Young's modulus.

It is desirable to have the optical power range as large as possible as long as it does not introduce any substantial aberration. With a preferred optical power range of 5 dpt, one can see that the preferred range for the Young's modulus is 0.8-3000 MPa in FIG. 6a and 2-10000 MPa in FIG. 6b. If one prefers optical power range 10 dpt then the preferred range for the Young's modulus is 2-800 MPa in FIG. 6a and 20-1000 MPa in FIG. 6b. It is still to be explored whether higher optical power ranges leads to astigmatisms or unwanted deformations in the central section of the membrane in physical implementations of these embodiments.

Figure 7A:
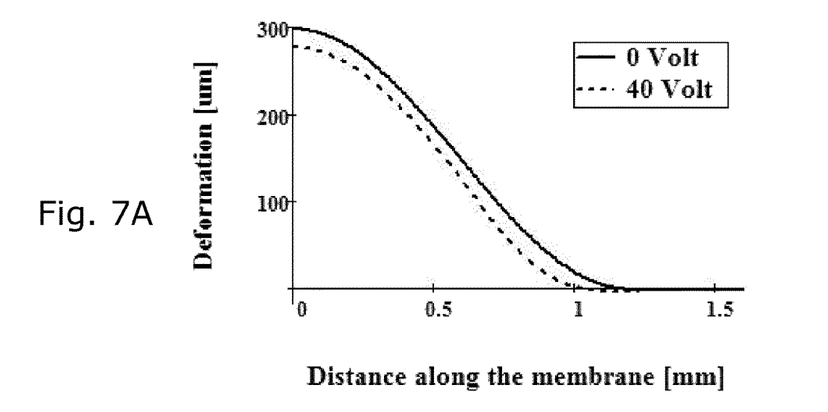
FIGS. 7A and B are graphs showing deformation of the membrane at different voltages for the embodiments of FIGS. 4A and B, respectively and with Young's modulus of the membrane equal to 44 MPa.
Figure 7B:
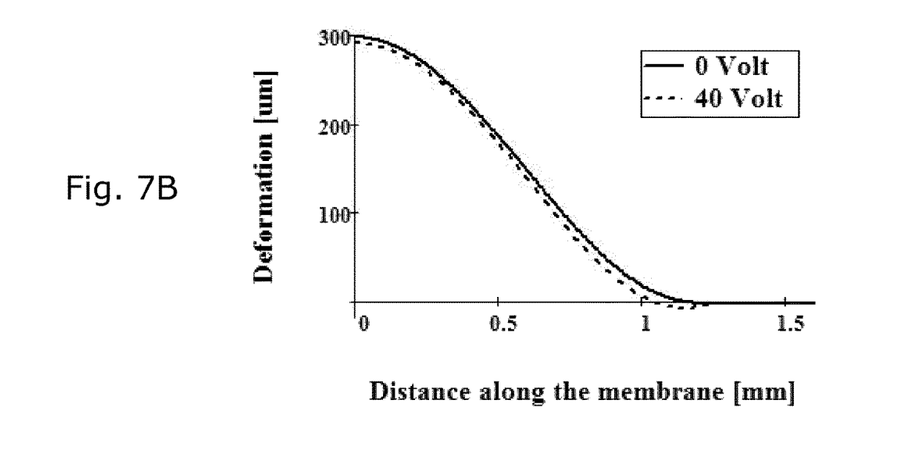

FIGS. 7A and B are graphs showing deformation of the membrane at different voltages for the embodiments of FIGS. 4A and B, respectively and with Young's modulus of the membrane equal to 44 MPa.

The following table summarizes some possible parameters of the pre-shaped membrane and the lens assembly (EFL is the effective focal length).

| Refractive index, n = 1.8 | | | | | | | |
|---|---|---|---|---|---|---|---|
| Useful aperture diameter [mm] | Membrane thickness [μm] | Max. SAG [μm] | Max. EFL [mm] | Min. OP [dpt] | Min. SAG [μm] | Min. EFL [mm] | Max. OP [dpt] |
| 1 | 10 | −1 | 200.0 | 5 | −78 | 2.0 | 500 |
| 2 | 20 | −3 | 250.0 | 4 | −250 | 2.5 | 400 |
| 5 | 50 | −12 | 333.3 | 3 | −977 | 4.0 | 250 |
| 10 | 100 | −31 | 500.0 | 2 | −625 | 25.0 | 40 |
| 20 | 200 | −63 | 1000.0 | 1 | −3125 | 20.0 | 50 |
| 40 | 300 | −125 | 2000.0 | 0.5 | −3750 | 66.7 | 15 |
| 60 | 400 | −169 | 3333.3 | 0.3 | −5625 | 100.0 | 10 |

The parameters in this table are exemplary values that might be used in the design of a lens assembly according to the invention. They are, however, not preferred values or by no means intended to limit the scope of the invention.

Actuator System

Actuators can be used that will mainly introduce a compressive/tensile pressure along the membrane to deform the membrane and introduce optical variation. If actuators are symmetrically positioned such that the pressure has symmetry of revolution around the optical axis, they will create mainly focus variation along the optical axis. By design, the actuator could apply non-symmetrical pressure and introduce cylindrical deformation, trefoil deformation and others.

The piezoelectric films described earlier are examples of such actuators. These can be thin film PZT, bulk Piezo, or any other kind that could create enough force to bend the membrane. Piezoelectric film on the membrane gets tensile stress when voltage is applied. This stress makes the film to contract in lateral dimensions resulting in bending of the membrane. To change the shape of the membrane in the central section, the piezo film will typically have to be laid out within the opening of the frame, which may limit the size of the central section and thus the aperture. Hence, other possible actuator systems are sometimes relevant and will be described in the following.

The membrane need not be in direct contact with the actuating system; it can be through a medium such as the lens body. Since the membrane is soft and supported by the lens body and since the lens body is non-fluid, deforming the lens body will change the shape of the membrane. For example, a number of actuators surrounding the lens body can be activated in synchrony to squeeze the waist of the lens body and push the membrane upwards. Activating only actuators in one side, the membrane shape will tilt and the focus can be moved transversely.

Figure 8:
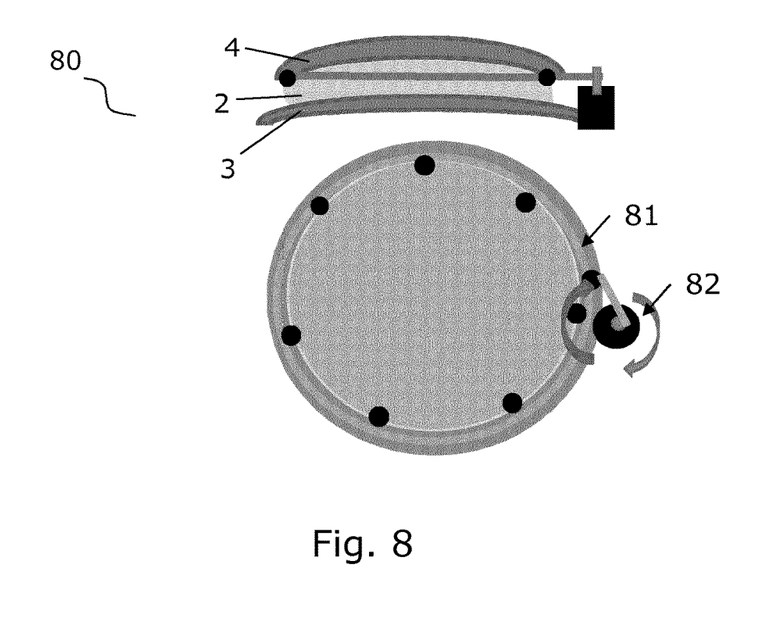
FIGS. 8 and 9 illustrate alternative actuation systems in accordance with different embodiments of the invention.
Figure 9:
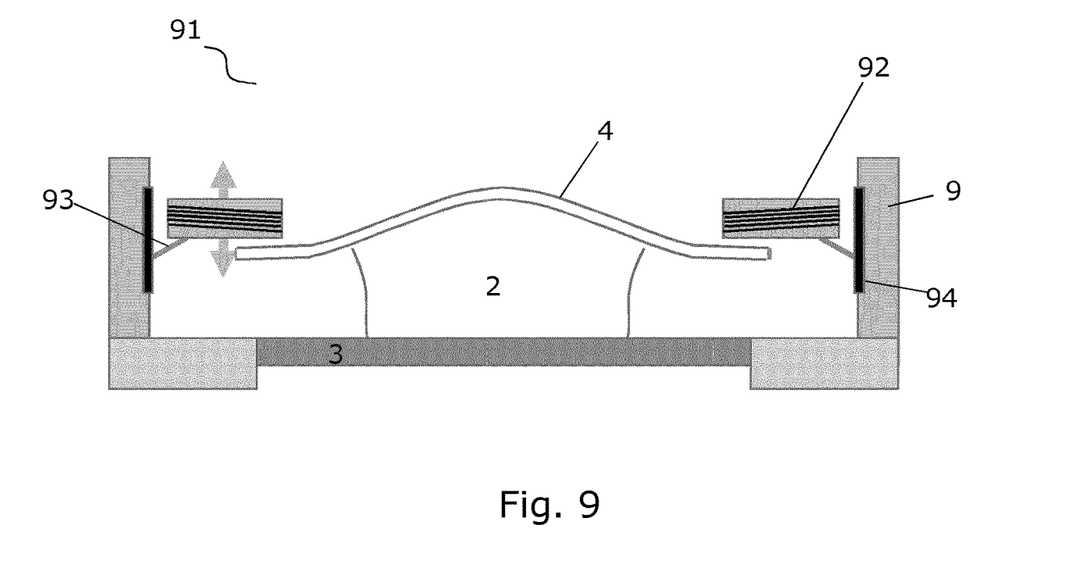

FIGS. 8 and 9 illustrate embodiments applying different actuators. FIG. 8 illustrates side- and top-view of a lens assembly 80 using strings 81 and a rotating motor 82 as actuating system. The rotation of the motor tightens/loosens the string and thereby changes the overall shape of the membrane and lens body.

FIG. 9 illustrates a lens assembly 91 using a VCM (Voice Coil Motor) based actuator system. The actuator system involves coils 92 held near the membrane 4 by soft or flexible holder 93, and magnets or magnetisable members 94, here integrated in the frame 9. When a current is drawn through coils 92, a magnetic field is induced that interacts with the magnets 94 to move the coils. By proper arrangement of coils, magnets and membrane, the coils can be used to apply a force on the membrane in a desired direction. FIG. 9 only illustrates an exemplary arrangement, the coils and magnets can be arranged to move in different directions. Alternatively, the coils 92 can be fixated and magnets or magnetisable members 94 can be movably held.

Figure 10:
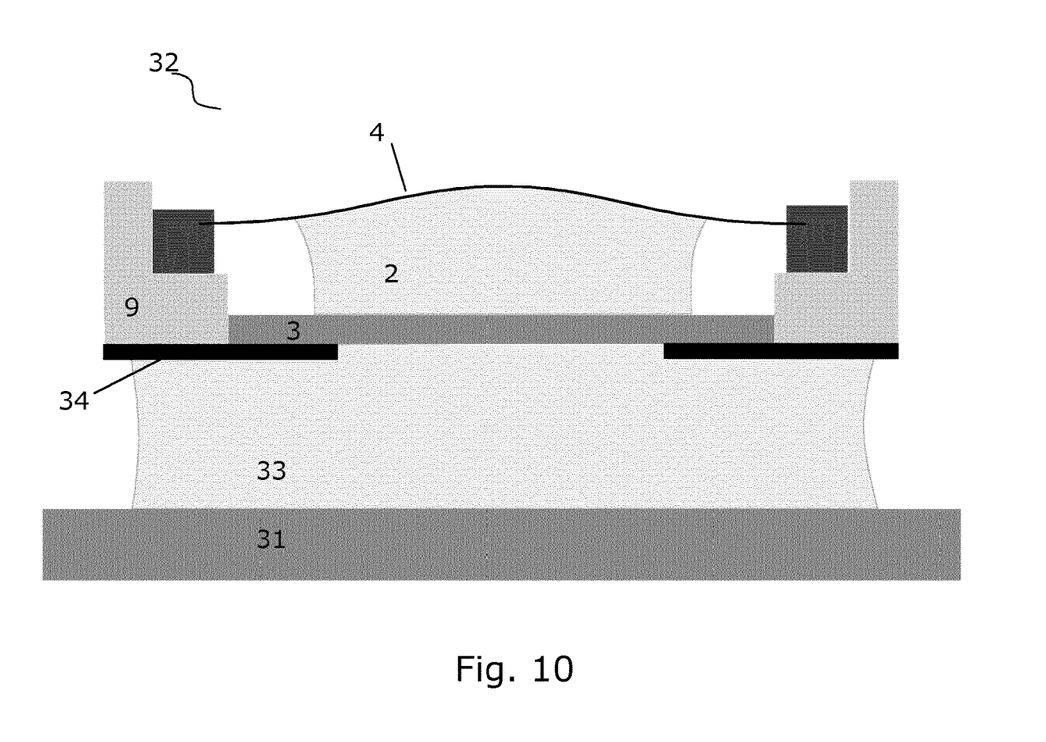
FIG. 10 illustrates a cross-sectional view of a lens assembly with an extra polymer layer and a cover glass in accordance with an embodiment of the invention.

If the lens assembly is to be integrated in a device that already has a cover glass, it may not be able to use the back window as cover glass, and a way to optically interface the lens assembly with the device is needed. FIG. 11 illustrates a lens assembly 32 with an extra polymer layer 33 and a cover glass 31. Here, the extra polymer layer 33, which is preferably passive, provides a flexible optical interface without any air/glass interfaces. FIG. 11 also shows an aperture stop 34 that could be added anywhere in the lens device.

APPLICATIONS

The lens assembly according to the invention can be used in a lens stack used for a camera module in various devices and in particular for mobile phone. This will have the advantage of not adding thickness. Usually the first lens of the stack is the best location to implement such variable focusing lens.

The invention will also allow larger tuneable lenses that can be adjusted around a non-zero optical power. Such lenses may be used for an adaptive spectacle for people who need to be corrected of presbitia, myopia, or astigmatism, as well as in scientific equipment like microscopes or focal plane of telescopes.

The invention claimed is:

1. An optical lens assembly comprising:
   a transparent and flexible membrane, wherein said transparent and flexible membrane is formed in a material having a Young's modulus in the range between 2 MPa and 1,000 MPa;
   a transparent back window;
   a transparent, deformable, lens body sandwiched between said transparent back window and said transparent, flexible membrane to form a lens with an optical axis being normal to a surface part of said transparent back window, wherein said lens body comprises a polymer network of cross-linked or partly cross-linked polymers, and, wherein said lens body further comprises a miscible oil or combination of oils;
   said transparent and flexible membrane being pre-shaped to impress a first overall shape to said transparent and flexible membrane and said non-fluid lens body, wherein with said first overall shape said lens has a substantial, non-zero first optical power;
   a rigid frame configured to support a circumference of the membrane; and
   an actuator system configured to apply a force to change the overall shape of the membrane and said lens body from the first overall shape to a second overall shape with which the lens has a different optical property;
   wherein said actuator system comprises piezoelectric actuators on a surface of said transparent and flexible membrane,
   wherein said back window has a planar surface facing the lens body, wherein said lens has a Sag of at least 10 μm when said actuator system is not activated, and
   wherein said flexible membrane has a Sag between 10 and 500 μm and an aperture diameter between 1 and 60 mm.

2. The optical lens assembly according to claim 1, wherein said flexible membrane has a thickness 5-30 μm.

3. The optical lens assembly according to claim 1, wherein said non-fluid lens body has an elastic modulus larger than 300 Pa.

4. The optical lens assembly according to claim 1, wherein the lens with the first overall shape has a Sag of at least 15 μm.

5. The optical lens assembly according to claim 1, wherein a central section of the pre-shaped membrane has a substantially spherical shape and a circumference of this central section defines an aperture of the lens assembly.

6. The optical lens assembly according to claim 1, wherein the Sag of at least 10 μm for the first overall shape corresponds to a first optical power of at least 5 diopters.

7. The optical lens assembly according to claim 1, where the different optical property is Sag and/or optical power and/or optical aberration.

8. The optical lens assembly according to claim 5, wherein the different optical property includes optical power, wherein the lens has a second optical power with the second overall shape and, wherein a difference between the first and the second optical power, an optical power range, is at least 2 diopters.

9. The optical lens assembly according to claim 1, wherein the lens body has an upper surface part shaped to correspond to the shape of the pre-shaped membrane.

10. The optical lens assembly according to claim 1, wherein the lens with the first overall shape has a Sag of at least 20 μm.

* * * * *